(12) United States Patent
Rozas

(10) Patent No.: US 7,904,789 B1
(45) Date of Patent: Mar. 8, 2011

(54) TECHNIQUES FOR DETECTING AND CORRECTING ERRORS IN A MEMORY DEVICE

(76) Inventor: Guillermo Rozas, Los Gatos, CA (US)

( * ) Notice: Subject to any disclaimer, the term of this patent is extended or adjusted under 35 U.S.C. 154(b) by 1171 days.

(21) Appl. No.: 11/395,710

(22) Filed: Mar. 31, 2006

(51) Int. Cl.
*G11C 29/00* (2006.01)

(52) U.S. Cl. .......................................... 714/763

(58) Field of Classification Search ................. 714/763
See application file for complete search history.

(56) References Cited

U.S. PATENT DOCUMENTS

| | | | | |
|---|---|---|---|---|
| 3,949,208 A | * | 4/1976 | Carter | 714/765 |
| 4,371,963 A | * | 2/1983 | Edwards et al. | 714/804 |
| 5,544,319 A | * | 8/1996 | Acton et al. | 709/246 |
| 5,610,929 A | * | 3/1997 | Yamamoto | 714/785 |
| 5,623,506 A | * | 4/1997 | Dell et al. | 714/766 |
| 5,757,826 A | * | 5/1998 | Fredrickson | 714/784 |
| 5,909,541 A | * | 6/1999 | Sampson et al. | 714/6 |
| 5,953,265 A | * | 9/1999 | Walton et al. | 365/200 |
| 6,035,369 A | * | 3/2000 | Ware et al. | 711/105 |
| 6,417,788 B1 | * | 7/2002 | McEwen et al. | 341/59 |
| 6,708,258 B1 | * | 3/2004 | Potter et al. | 711/154 |
| 6,772,383 B1 | * | 8/2004 | Quach et al. | 714/746 |
| 6,981,176 B2 | * | 12/2005 | Fruehling et al. | 714/11 |
| 7,114,119 B1 | * | 9/2006 | Morris | 714/766 |
| 2007/0079217 A1 | * | 4/2007 | Haugan et al. | 714/763 |
| 2009/0037793 A1 | * | 2/2009 | Chuang et al. | 714/769 |

* cited by examiner

*Primary Examiner* — Scott T Baderman
*Assistant Examiner* — Enam Ahmed

(57) ABSTRACT

A technique for detecting and correcting errors in a memory device, in accordance with one embodiment of the present invention, includes a data storage area arranged in a plurality of blocks, wherein each block contains a plurality of words. The memory device also includes an error detection/correction storage area for storing error detection/correction bytes corresponding to each word in each block and error detection words corresponding to each block.

28 Claims, 6 Drawing Sheets

TECHNIQUES FOR DETECTING AND CORRECTING ERRORS IN A MEMORY DEVICE

BACKGROUND OF THE INVENTION

In the conventional art various forms of error detection and correction are utilized to correct errors in memories, such as caches, system memory, frame buffers and the like that are implemented using static and dynamic random access memory (RAM), read only memory (ROM), and the like. A conventional memory device 100 is illustrated in FIG. 1. The memory device includes an array of memory cells 110, 120, a row decoder 130, a column decoder 140, and error detection/correction logic 150. Typically, the array of memory cells for storing data 110 is extended with additional memory cells for storing error detecting and/or correcting codes 120. The memory cells for storing the error detection/correction codes 120 store a quantity derived from the memory cells utilized for storing data 110. The error detection/correction codes allow corrupted data to be detected and corrected most of the time. One conventional error detecting technique extends every 8 bits of data with an additional parity bit used for detecting a single bit error. One conventional error technique extends every 64 bits of data with an additional 8 bits of error correcting code (ECC) to detect and correct single bit errors and to detect double-bit errors without correction.

Other techniques for detecting and correcting multi-bit errors have been developed. However, conventional methods for detecting and correction multi-bit errors consume a large portion of the memory cell array and/or result in undesirable memory latency.

SUMMARY OF THE INVENTION

Embodiments of the present invention are directed toward techniques for detecting and correcting errors in a memory device. In one embodiment, a memory device includes a data storage area arranged in a plurality of blocks, wherein each block contains a plurality of words. The memory device also includes an error detection/correction storage area for storing error detection/correction bytes corresponding to each word in each block and error detection words corresponding to the words in each block.

In another embodiment, a method of writing data in a memory device includes computing an error detection/correction byte for each word in a block. An error detection word is computed from the words in the block and an error detection/correction byte is computed for the error detection word. The words, the corresponding error detection/correction bytes, the error detection word and its error detection/correction byte are written to the corresponding block in the memory device.

In yet another embodiment, a method of reading data in a memory device includes detecting errors in a word using an error detection/correction byte corresponding to the word and an error detection word corresponding to a block containing the word to be read. Single-bit errors are corrected using the error detection/correction byte, if a single-bit error in the word is detected. A Double-bit error is corrected using the error detection/correction byte and the error detection word, if a double-bit error in the word is detected.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
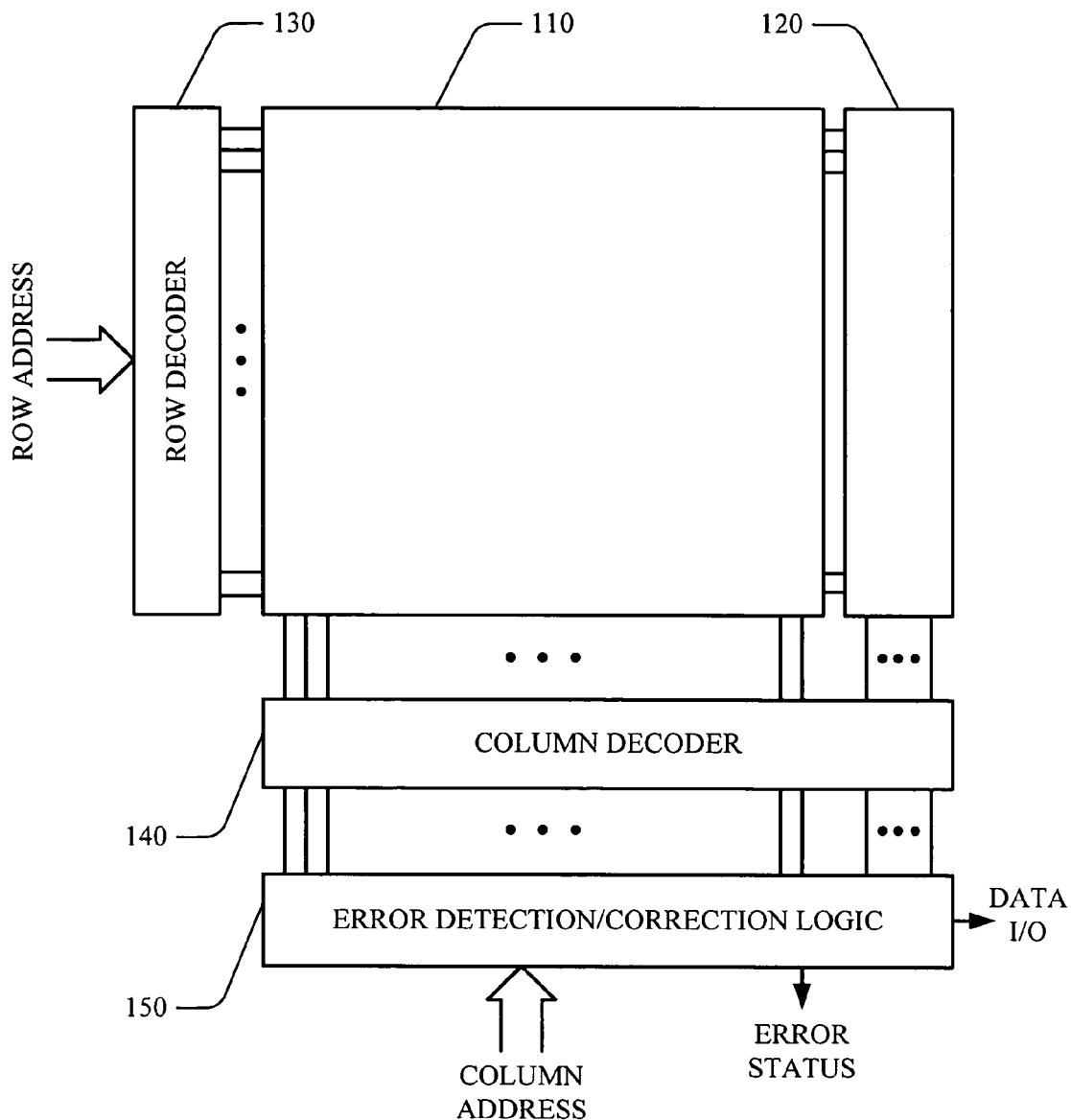
FIG. 1 shows a block diagram of a memory device according to the conventional art.
Figure 2:
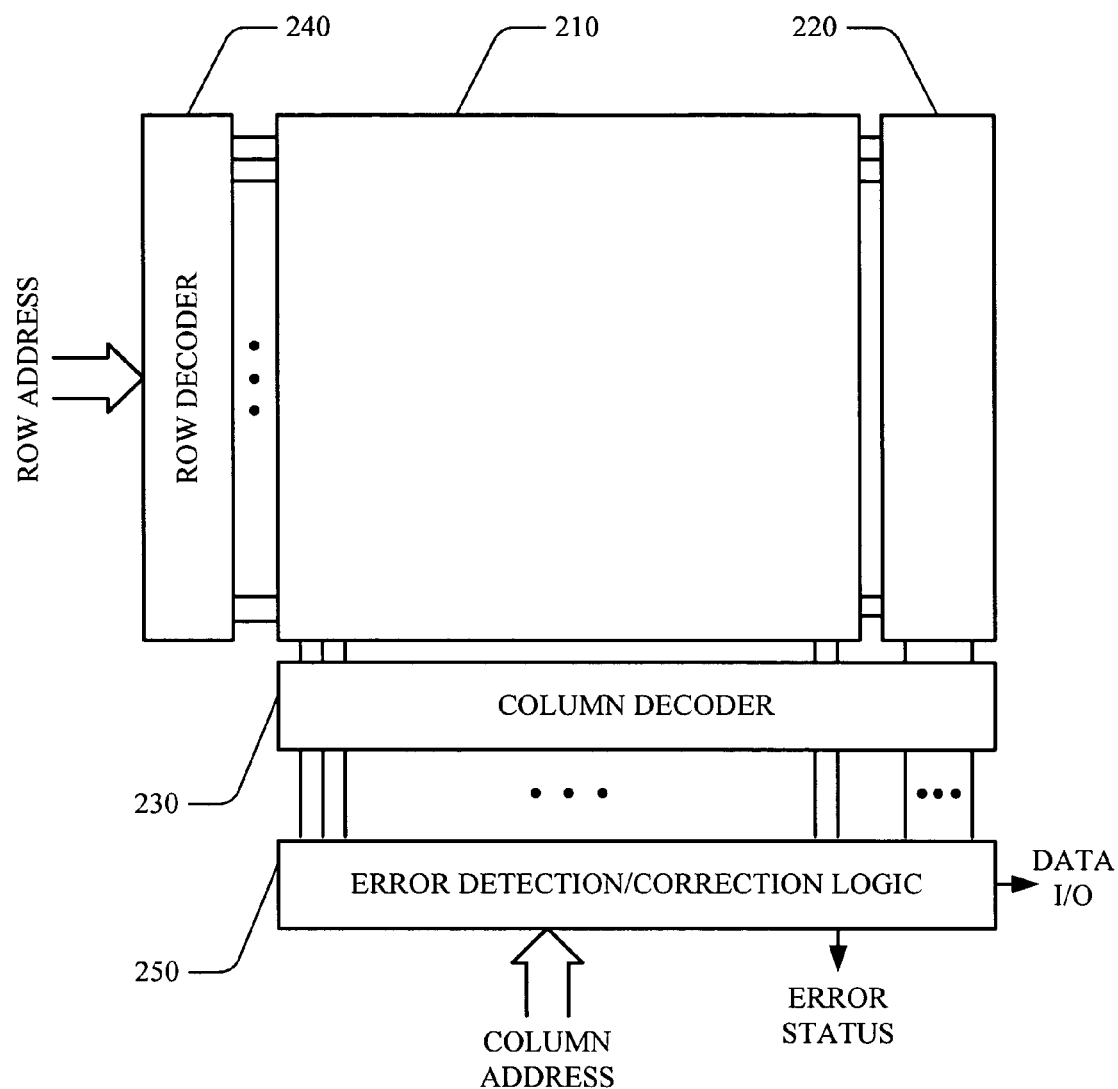
FIG. 2 shows a block diagram of a memory device in accordance with one embodiment of the present invention.

Referring to FIG. 2, an exemplary memory device, in accordance with one embodiment of the present invention, is shown. The memory device may be a computer readable medium, such as dynamic or static random access memory (RAM), read only memory (ROM), flash memory or the like. The memory device includes an array of memory cells 210, 220, 230, a row decoder 240, a column decoder 250 and error detection/correction logic 260. The memory cell array includes a data storage area 210, a word-wise (e.g., row) error detection/correction storage area 220 and a bit-wise (e.g., column) error detection storage area 230.

The data storage area 210 includes an array of memory cells arranged in a plurality of blocks. Each block contains m words. Each word includes n bytes of p bits. A q-bit error detection/correction code is calculated for each word to produce an error detection/correction byte corresponding to the particular word. The error detection/correction byte of each word is stored in the corresponding word-wise error detection/correction storage area 220. An error detection bit is also calculated from each respective bit in the words of a block to produce an error detection word for each block. The error detection word of each block is stored in the corresponding bit-wise error detection storage area 230. A q-bit error detection/correction code is also calculated for the error detection word and stored in the corresponding word-wise error detection/correction storage area 220.

The error detection/correction logic 260 may be adapted to generate the error detection/correction bytes and/or the error detection words. The error detection/correction logic 260 may also be adapted to detect and correct single bit errors in a word utilizing the error detection/correction bytes. In addition, the error detection/correction logic 260 may also be adapted to detect and correct double-bit errors in a single word in a given block utilizing the error detection/correction bytes of the given block in combination with the error detection word of the given block. Although the memory device is discussed herein as having error detection/correction logic 260 coupled to a single array of memory cells 210, 220, 230, it is understood that the error detection/correction logic 260 may be external to the array since it can be shared per access rather then per row or column.

In an exemplary implementation, the data storage area 210 is organized in 64-bit units. Each 64-bit unit, referred herein to as a word, is arranged as eight 8-bit bytes and extended by an additional 8-bit ECC byte in a word-wise ECC byte storage area 220. The data storage is further organized in blocks of eight words. The eight words (e.g., eight 8-bit bytes) in each block are extended by an additional parity bit in a bitwise ECC word storage area 230. That is, bit 0 of byte 0 of the ECC word storage area 230 stores the bit-wise exclusive-or (XOR) of all the words in the data storage area 210 for the given block. The parity bits for each respective bit in the eight words form an ECC word of eight bytes of 8-bit each. An ECC byte of the ECC word is determined and stored in the word-wide ECC byte storage area 220. The data bits arranged in eight words of eight 8-bit byes, the corresponding ECC bytes and the ECC word are illustrated in Table 1.

TABLE 1

| [word 0] | byte 0 | byte 1 | byte 2 | byte 3 | byte 4 | byte 5 | byte 6 | byte 7 | ECC byte |
| [word 1] | byte 0 | byte 1 | byte 2 | byte 3 | byte 4 | byte 5 | byte 6 | byte 7 | ECC byte |
| [word 2] | byte 0 | byte 1 | byte 2 | byte 3 | byte 4 | byte 5 | byte 6 | byte 7 | ECC byte |
| [word 3] | byte 0 | byte 1 | byte 2 | byte 3 | byte 4 | byte 5 | byte 6 | byte 7 | ECC byte |
| [word 4] | byte 0 | byte 1 | byte 2 | byte 3 | byte 4 | byte 5 | byte 6 | byte 7 | ECC byte |
| [word 5] | byte 0 | byte 1 | byte 2 | byte 3 | byte 4 | byte 5 | byte 6 | byte 7 | ECC byte |
| [word 6] | byte 0 | byte 1 | byte 2 | byte 3 | byte 4 | byte 5 | byte 6 | byte 7 | ECC byte |
| [word 7] | byte 0 | byte 1 | byte 2 | byte 3 | byte 4 | byte 5 | byte 6 | byte 7 | ECC byte |
| [ECC word] | byte 0 | byte 1 | byte 2 | byte 3 | byte 4 | byte 5 | byte 6 | byte 7 | ECC byte |

Any conventional double-bit error detection (DED) single-bit error correction (SEC) code may be utilized to generate the error detection/correction bytes. Accordingly, the error detection/correction byte can be utilized to detect two bit errors in the corresponding word and correct a single error in the corresponding word. Any conventional single-bit error detection (SED) code may be utilized to generate the error detection word. For example, in one implementation, the bits of the error detection word are generated by the column-wise parity (e.g., XOR) of all the data bits for the n words in a block. Implementations may use either positive or negative parity to generate the bits of the error detection word. The error detection/correction byte of the error detection word is computed using the selected double-bit error detection single-bit error correction (DED-SEC) code applied to the XOR generated bytes of the error detection word.

Figure 3:
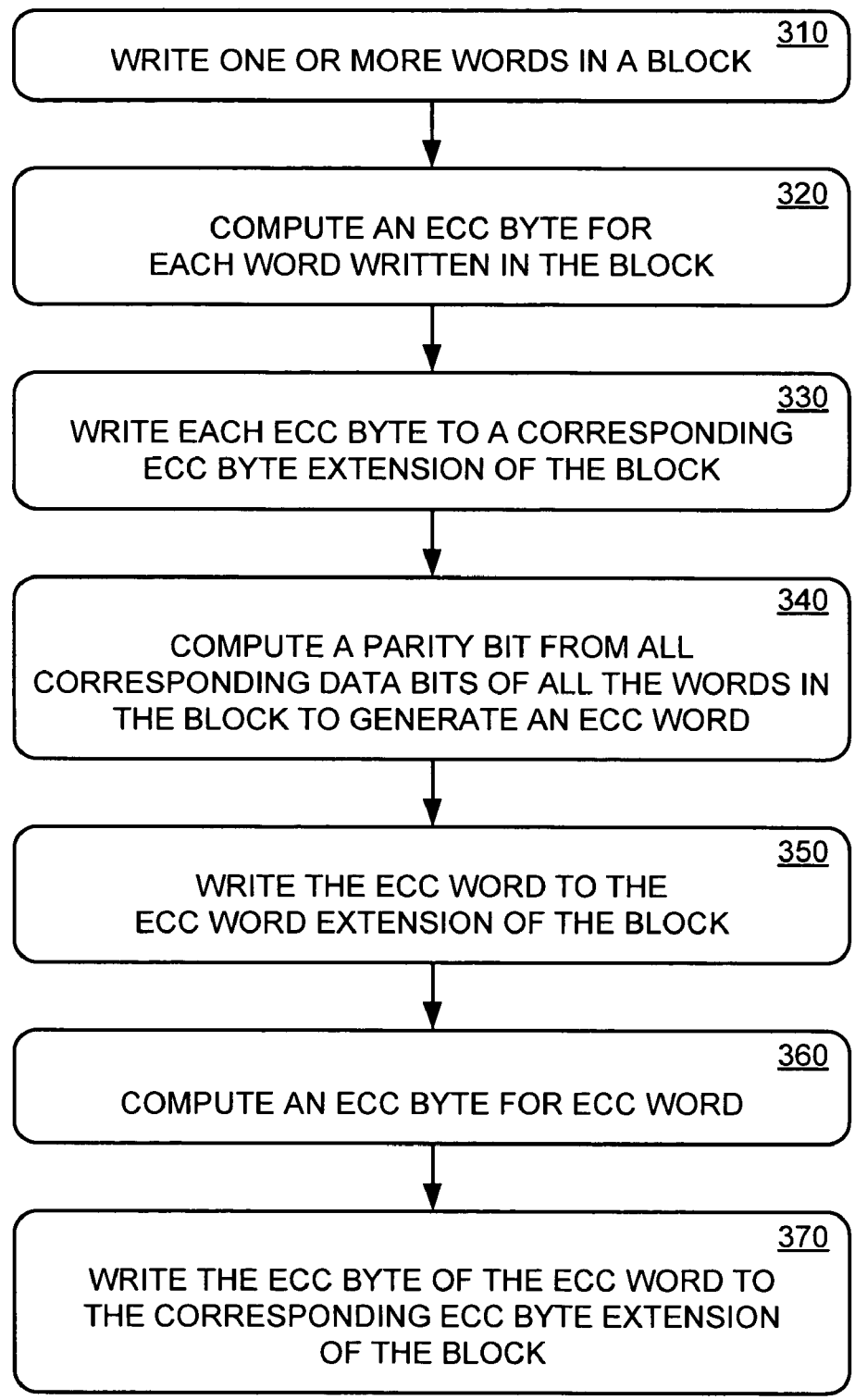
FIG. 3 shows a flow diagram of a method of writing data in a memory device in accordance with one embodiment of the present invention.

Referring now to FIG. 3, a method of writing data in a memory device, in accordance with one embodiment of the present invention, is shown. The method includes computing one or more error detection/correction bytes for each word in a block and one or more error detection words from all the words in the block. The error detection/correction bytes are stored in the respective error detection/correction extension corresponding to the words in the block. The error detection word is stored in an error detection extension corresponding to the block. In addition, an error detection/correction byte is computed for the error detection word and stored in a corresponding error detection/correction byte extension. In one implementation, the method of writing data includes computing and storing one or more ECC bytes and one or more ECC words.

More specifically, the method includes writing one or more words in a given block of a memory device, at 310. At 320, an ECC byte is computed for each of the words that are written in the block. The ECC byte may be computed in accordance with any DED-SEC technique. Each ECC byte is written to a corresponding portion of the ECC byte extension of the given block, at 330. In one implementation, the ECC byte extension of the given block may be located adjacent to the block and arranged along the rows of the block. In other embodiments, the ECC byte extension may be organized based on a plurality of blocks, one or more pages, one or more sectors, one or more banks, or the like.

At 340, parity bits are computed from all corresponding data bits of all the words in the block to generate an ECC word. That is a column-wise exclusive-OR (XOR) is calculated for each of the respective data bits of the words 0 through n of the block. The ECC word is written to the ECC word extension of the given block at 350. In one implementation, the ECC word extension of the given block may be located adjacent to the block and arranged as an additional row in the block. In another embodiment, the ECC word extension may be located adjacent to the block and arranged along the rows of the block by dividing the ECC word into n chunks, as described in more detail with reference to FIG. 5.

At 360, an ECC byte of the ECC word is computed. The ECC byte of the ECC word is written to the corresponding ECC byte extension, at 370. Accordingly, the bits corresponding to the ECC byte for the ECC word is the double-bit detection single-bit error correction code of the parity bits forming the ECC word.

Figure 4A:
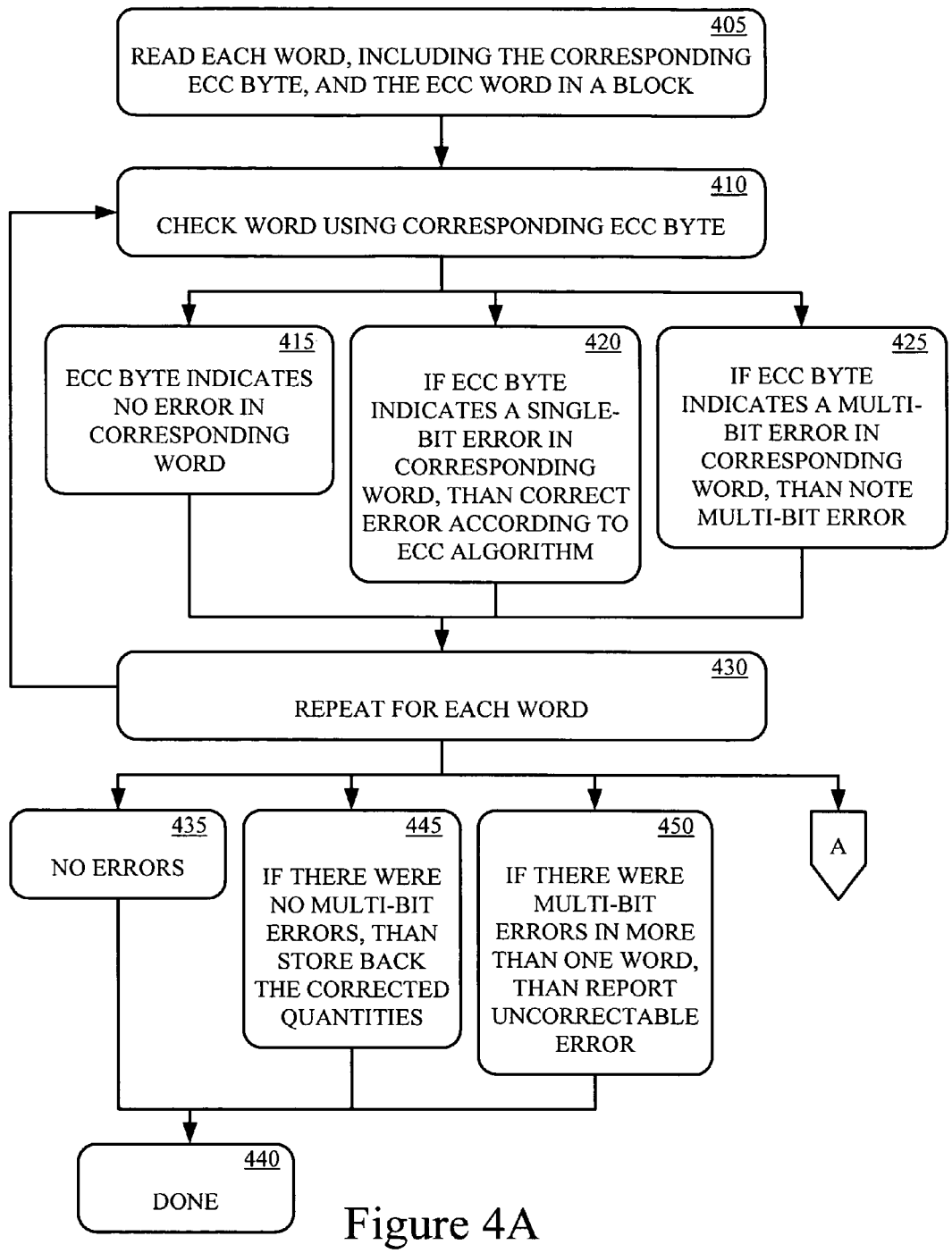
FIGS. 4A and 4B show a flow diagram of a method of reading data in a memory device in accordance with one embodiment of the present invention.
Figure 4B:
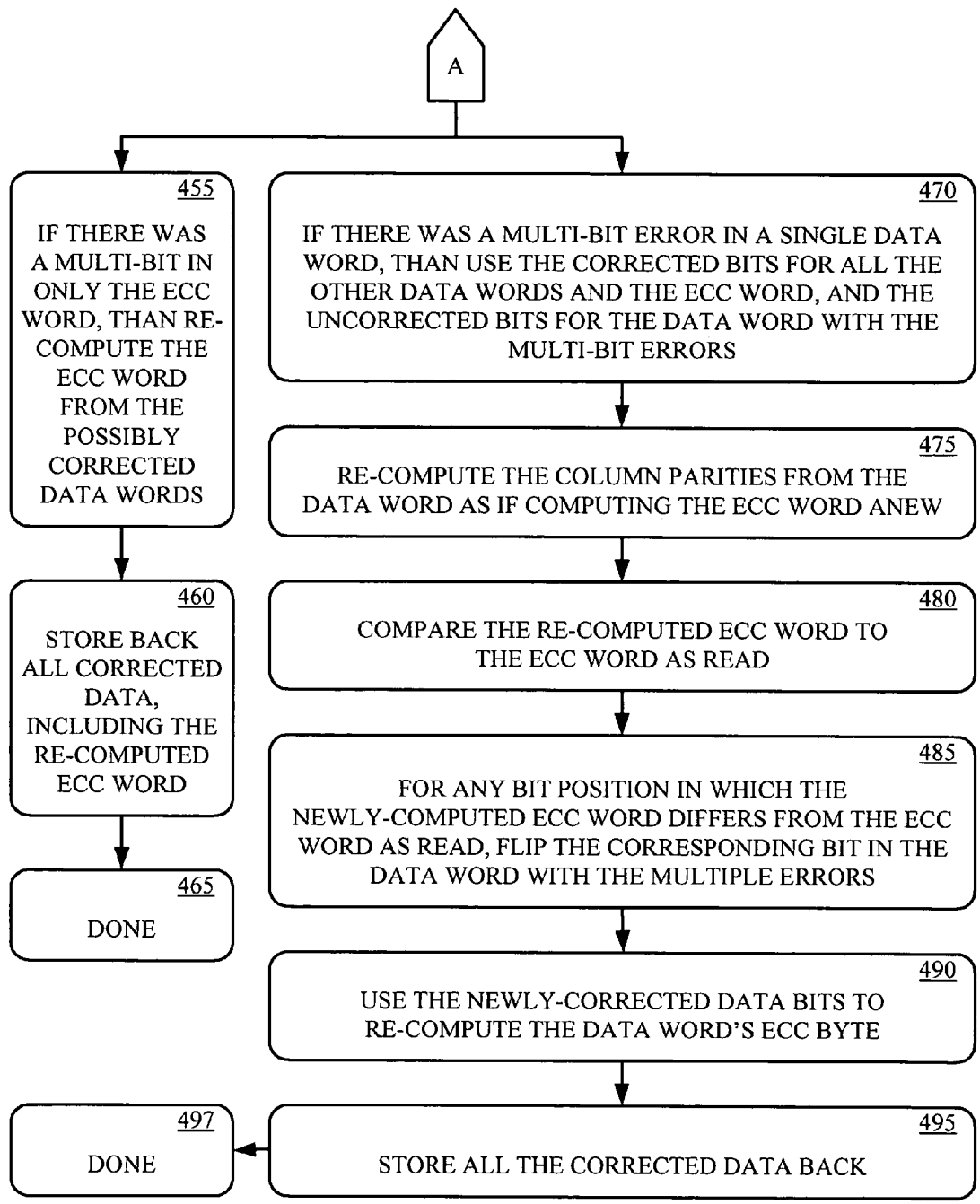

Referring now to FIG. 4, a method of reading data in a memory device, in accordance with one embodiment of the present invention, is shown. The method of reading data includes detecting data errors using the error detection/correction bytes. Single-bit errors within a data word are corrected using the error detection/correction bytes. In addition, a double-bit error in a single word of a block is corrected using the error detection word. In one implementation, the method of reading includes detecting data errors and correcting the errors using one or more ECC bytes and one or more ECC words.

More specifically, each word in a block, the corresponding ECC byte, and the ECC word for the block is read, at 405. At 410, each word is checked against the corresponding ECC byte. It is determined from the check whether: 1) the ECC byte indicates that there is no error in the corresponding word 415, 2) the ECC byte indicates a single-bit error in the corresponding word 420, or 3) the ECC byte indicates a multi-bit error in the corresponding word 425. The check, at 410, is repeated for each word read in the block 430.

If there are no errors in any of the words read in the block, at 435, then the read process is done, at 440. If the ECC byte indicates a single bit error in a given corresponding word, then the error in the given word is corrected according to the ECC algorithm that is utilized, at 420. At 445, the corrected quantity is stored back in the corresponding word, if there were no multiple-bit errors in any of the words read in the block. After the single-bit errors are corrected and stored back in the memory array, the read process is done 440, if there were no multiple-bit errors in any of the words.

If there are multi-bit errors in more than one word in the block, then the errors are uncorrectable, at 450. A report may be sent to the operating system, application that generated the read request, or the like, indicating that an uncorrectable memory read error has occurred.

At 455, if there is a multi-bit error in the ECC word, than the ECC word is recomputed from the data words. The re-computed ECC word is than stored back, at 460, and the read process is done, at 465.

If there is a multi-bit error in a single data word, then the corrected bits for all the other data words and the ECC word, and the uncorrected bits for the data word with the multi-bit error are used to correct the multi-bit error, at 470. In particular, the column parities from the data words are re-computed as if computing the ECC word anew, at 475. At 480, the re-computed ECC word is compared to the ECC word as read. For any bit position in which the re-computed ECC word differs from the ECC word as read, the corresponding bit in the data word with the multi-bit error is flipped, at 485. It is to be noted that the errors in the data word with multi-bit errors may all be in the ECC byte corresponding to the data word rather than the data bits. In such cases there may not be any data bits to flip.

At 490, the newly-corrected data bits in the data word, with the multi-bit error, are used to re-compute the data word's ECC byte. The corrected data word that had the multi-bit error and the re-computed ECC byte are stored back, at 495. Once the corrected data word and re-computed ECC byte are stored the memory read process is done, at 497.

Figure 5:
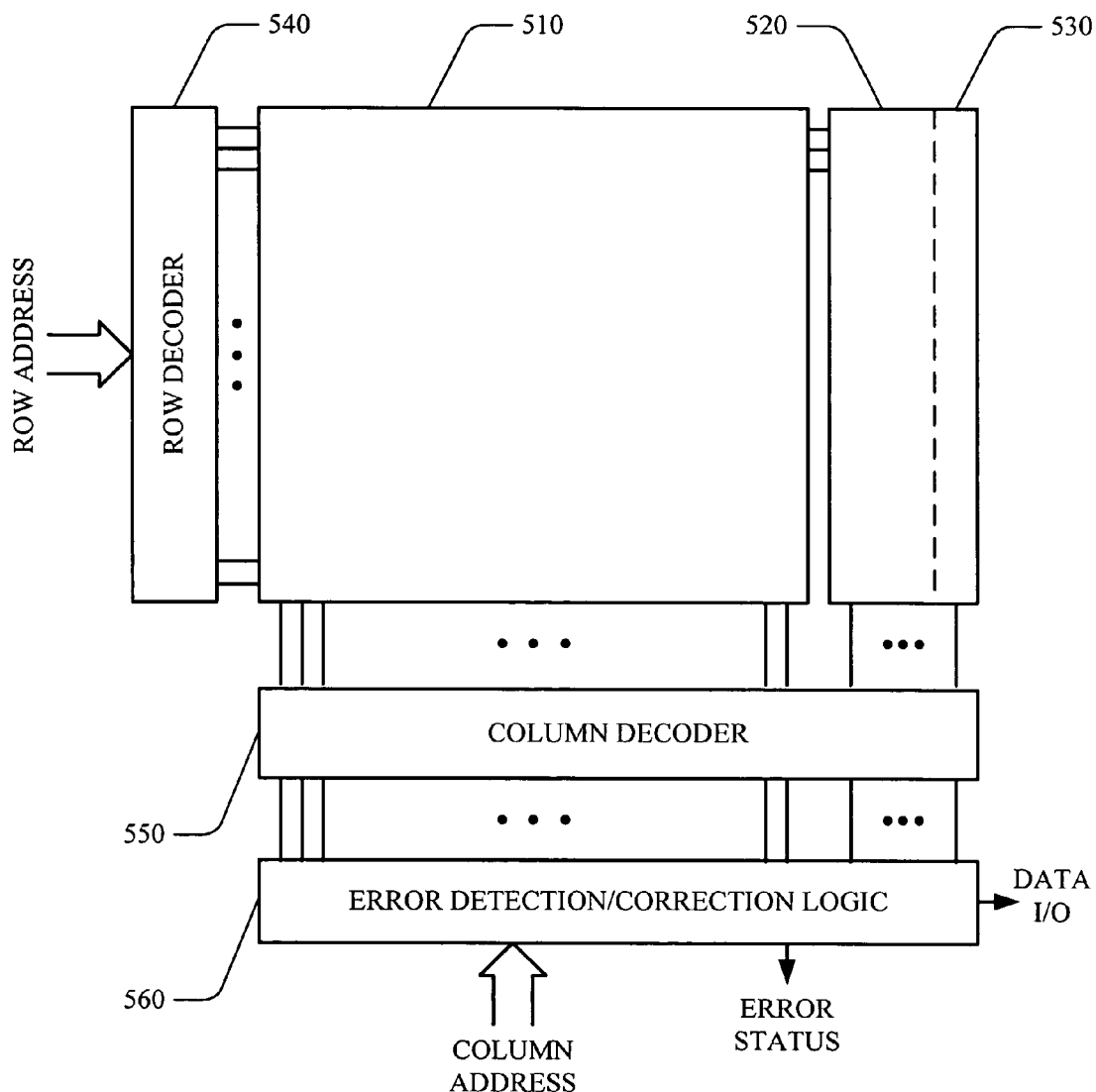
FIG. 5 shows a block diagram of a memory device in accordance with another embodiment of the present invention.

Those skilled in the art appreciate that adding extra rows in the memory array to store the corresponding ECC word of each block complicates the address decoding. Accordingly, it may be advantageous to store the ECC word of each block as extensions of each word in the block. Referring now to FIG. 5, an exemplary memory device, in accordance with another embodiment of the present invention, is shown. The memory device includes an array of memory cells 510, 520, 530, a row decoder 540, a column decoder 550 and error detection/correction logic 560. The memory cell array includes a data storage area 510 and an error detection/correction extension 520, 530.

The data storage area 510 includes an array of memory cells that are arranged in a plurality of blocks. Each block contains m words. Each word includes n bytes of p bits. A q-bit error detection/correction code is calculated for each word to produce an error detection/correction byte corresponding to the particular word. The error detection/correction byte of each word is stored in a first portion of the corresponding error detection/correction extension 520. An error detection bit is also calculated from each respective bit of a corresponding block of m words to produce an error detection word for each block. An error detection/correction byte is also calculated for the error detection word. The error detection word and the corresponding error detection/correction byte are divided into m chunks. The respective chunks of the error detection word and corresponding error detection/correction byte are stored in a second portion of the corresponding error detection/correction extension 530.

In an exemplary implementation, the data storage area 510 is organized in 64-bit units. Each 64-bit unit, referred herein to as a word, is arranged as eight 8-bit bytes and extended by an additional 8-bit ECC byte and an additional 9-bit ECC word chunks. The ECC word chunks include the ECC word and the ECC byte of the ECC word. The data bits arranged in eight words of eight 8-bit byes, the corresponding ECC bytes and the ECC word chunks are illustrated in Table 2.

TABLE 2

| [word 0] | byte 0 | byte 1 | ... | byte 7 | ECC byte | ECC word chnk 0 |
| [word 1] | byte 0 | byte 1 | ... | byte 7 | ECC byte | ECC word chnk 1 |
| [word 2] | byte 0 | byte 1 | ... | byte 7 | ECC byte | ECC word chnk 2 |
| [word 3] | byte 0 | byte 1 | ... | byte 7 | ECC byte | ECC word chnk 3 |
| [word 4] | byte 0 | byte 1 | ... | byte 7 | ECC byte | ECC word chnk 4 |
| [word 5] | byte 0 | byte 1 | ... | byte 7 | ECC byte | ECC word chnk 5 |
| [word 6] | byte 0 | byte 1 | ... | byte 7 | ECC byte | ECC word chnk 6 |
| [word 7] | byte 0 | byte 1 | ... | byte 7 | ECC byte | ECC word chnk 7 |

Any conventional double-bit error detection (DED) single-bit error correction (SEC) code may be utilized to generate the error detection/correction bytes. Accordingly, the error detection/correction byte can be utilized to detect two bit errors in the corresponding word and correct a single error in the corresponding word. The bits of the error detection word are generated by the column-wise parity (e.g., XOR) of all the data bits for words 0-7. That is, bit 0 of byte 0 of the error detection word is the exclusive-OR of all the bits 0 of all the bytes 0 of all the data words. Implementations may use either positive or negative parity to generate the bits of the error detection word. The error detection/correction byte of the error detection word is computed using the selected DED-SEC algorithm applied to the XOR generated bytes of the error detection word.

In accordance with embodiments of the present invention, single-bit errors due to soft errors do not become double-bit errors due to additional soft errors. In addition, although hard errors are not corrected, such errors are not aggravated either. The embodiments of the present invention also advantageously utilize less of the memory cell array to detect and correct two-bit errors in a given block of memory. The embodiments of the present invention also do not incur as much memory latency as conventional double-bit error detection and correction techniques.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A memory device comprising:
 a data storage area of memory cells arranged in a plurality of blocks, wherein a block includes a plurality of words; and
 an error detection/correction storage area of memory cells configured to store a) error detection/correction bytes and b) error detection words, wherein an error detection/correction byte is calculated from a corresponding word in the block and wherein a respective bit of the error detection word is calculated from respective bits in the corresponding words in the block.

2. The memory device of claim 1, wherein the error detection/correction byte is stored in a corresponding word-wise extension of the data storage area.

3. The memory device of claim 2, wherein the error detection word is stored in a bit-wise extension of the data storage area.

4. The memory device of claim 1, wherein a respective chunk of the corresponding error detection word is stored in the corresponding word-wise extension of the data storage area.

5. The memory device of claim 1, further comprising an error detection/correction logic, coupled to the data storage area and the error detection/correction storage area, configured to generate the error detection/correction bytes.

6. The memory device of claim 1, further comprising an error detection/correction logic, coupled to the data storage area and the error detection/correction storage area, configured to generate the error detection words.

7. The memory device of claim 1, further comprising an error detection/correction logic, coupled to the data storage area and the error detection/correction storage area, configured to detect and correct a single bit error in a word in the data storage area utilizing a corresponding error detection/correction byte.

8. The memory device of claim 1, further comprising an error detection/correction logic, coupled to the data storage area and the error detection/correction storage area, configured to detect and correct a double-bit error in a single word in a given block of the data storage area utilizing a corresponding error detection/correction byte of the given block in combination with an error detection word of the given block.

9. The memory device of claim 1, wherein the error detection/correction byte comprises an error correction code (ECC) byte of a corresponding word in the data storage area.

10. The memory device of claim 1, wherein the error detection word comprises a parity bit for respective bits in the corresponding words of a block in the data storage area.

11. A method of writing data, the method comprising:
computing, by an error detection/correction logic circuit, an error detection/correction byte for a word in a block;
computing, by the error detection/correction logic circuit, an error detection word wherein a respective bit in the error detection word is calculated from respective bits of the plurality of words in the block;
computing, by the error detection/correction logic circuit, an error detection/correction byte for the error detection word; and
storing the error detection/correction byte for the word in the block, the error detection word, and the error detection/correction byte for the error detection word in a memory device.

12. The method of claim 11, further comprising storing the word in a data storage area of the memory device.

13. The method of claim 11, further comprising storing the error detection/correction byte for the word, the error detection word for the plurality of words in a block including the word, and the error detection/correction byte for the error detection word in an extension of the data storage area.

14. The method of claim 13, wherein the error detection/correction byte of the word is stored in a word-wise portion of the extension of the data storage area corresponding to the word.

15. The method of claim 14, wherein the error detection word and the error detection/correction byte of the error detection word are stored in a bite-wise portion of the extension of the data storage area.

16. The method of claim 14, wherein a plurality of chunks of the error detection word and the error detection/correction byte of the error detection word are stored in respective word-wise portions of the extension of the data storage area corresponding to the words in the block.

17. The method of claim 11, wherein:
the error detection/correction byte for the word is generated by computing an error correction code (ECC) for the word; and
the error detection/correction byte for the error detection word is generated by computing an ECC for the error detection word.

18. The method of claim 17, wherein the error detection word is generated by computing a parity bit for respective bits in the corresponding words in the block.

19. A method comprising:
reading a) a block of data, b) corresponding error detection/correction bytes and c) a corresponding error detection word, wherein the error detection/correction byte is calculated from a corresponding word in the block of data and wherein a respective bit of the error detection word is calculated from respective bits in the words in the block of data;
detecting, by an error detection/correction logic circuit, errors in a given word of the block of data using a) a given one of the error detection/correction bytes computed from the given word and b) the error detection word;
correcting, by the error detection/correction logic circuit, a single-bit error in the given word using the given one of the error detection/correction bytes, if a single-bit error in the word is detected; and
correcting, by the error detection/correction logic circuit, a double-bit error in the given word using a) the given one of the error detection/correction bytes and b) the error detection word, if a double-bit error in the word is detected.

20. The method of claim 19, wherein said detecting errors further comprises:
reading the words in the block, the error detection/correction byte for the word in the block, the error detection word for the block and the error detection/correction byte for the error detection word;
checking a word against the corresponding error detection/correction byte; and
checking the error detection word against the corresponding error detection/correction byte.

21. The method of claim 19, wherein correcting the single-bit error further comprises:
correcting the error in the given word; and
storing the corrected word.

22. The method of claim 19, wherein correcting the double-bit error further comprises:
re-computing the error detection word from the words in the block after single bit error correction, if necessary;
comparing the re-computed error detection word to the error detection word as read or as corrected by using single-bit error correction, if necessary;
correcting a given word by flipping a corresponding bit for any bit position in which the re-computed error detection word differs from the error detection word as read;
re-computing the error detection/correction byte corresponding to the corrected given word; and
storing the corrected given word and the re-computed error detection/correction byte.

23. The method of claim 22, further comprising re-computing, by the error detection/correction logic circuit, the error detection word from the words in the block, if the multi-bit error was in the error detection word.

24. The method of claim 19, wherein:

the error detection/correction byte for the word is generated by computing an error correction code (ECC) for the word; and the error detection/correction byte for the error detection word is generated by computing an error correction code (ECC) for the error detection word.

25. The method of claim 20, wherein the error detection word is generated by computing a parity bit for respective bits in the corresponding words in the block.

26. A memory device comprising:

a means for computing an error detection/correction byte for a word in a block;

a means for computing an error detection word from respective bits in the corresponding words in the block;

a means for computing an error detection/correction byte for the error detection word; and a means for storing the error detection/correction byte for the word in the block, the error detection word, and the error detection/correction byte for the error detection word in a data storage area.

27. The memory device of claim 26, further comprising:

a means for retrieving the error detection/correction byte for the word in the block, the error detection word, and the error detection/correction byte for the error detection word from the data storage area;

a means for detecting errors in a given word using a given error detection/correction byte corresponding to the given word and the error detection word;

a means for correcting a single-bit error in the given word using the given error detection/correction byte, if a single-bit error in the given word is detected; and a means for correcting a double-bit error in the given word using the given error detection/correction byte corresponding to the given word and the error detection word, if a double-bit error in the given word is detected.

28. The memory device of claim 27, wherein:

the error detection/correction byte for the word comprises an error correction code (ECC);

the bits of the error detection word comprises a parity bit; and the error detection/correction byte for the error detection word comprises an ECC.

\* \* \* \* \*

UNITED STATES PATENT AND TRADEMARK OFFICE
CERTIFICATE OF CORRECTION

| | | |
|---|---|---|
| PATENT NO. | : 7,904,789 B1 | Page 1 of 1 |
| APPLICATION NO. | : 11/395710 | |
| DATED | : March 8, 2011 | |
| INVENTOR(S) | : Rozas | |

It is certified that error appears in the above-identified patent and that said Letters Patent is hereby corrected as shown below:

Column 7, line 63, in Claim 15, delete "bite-wise" and insert -- bit-wise --.

Signed and Sealed this
Twenty-eighth Day of June, 2011

David J. Kappos
*Director of the United States Patent and Trademark Office*